(12) United States Patent
Jordan

(10) Patent No.: US 6,674,382 B1
(45) Date of Patent: Jan. 6, 2004

(54) LINE DRIVER STRUCTURES THAT ENHANCE DRIVER PERFORMANCE

(75) Inventor: Edward Perry Jordan, Kernersville, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/272,736

(22) Filed: Oct. 16, 2002

Related U.S. Application Data

(60) Provisional application No. 60/379,333, filed on May 8, 2002, provisional application No. 60/379,383, filed on May 8, 2002, and provisional application No. 60/379,590, filed on May 8, 2002.

(51) Int. Cl.[7] .......................... H03M 1/66; H04L 12/18
(52) U.S. Cl. .................. 341/144; 341/143; 341/130; 341/150; 375/257; 375/285; 375/216
(58) Field of Search .................. 341/144, 143, 341/130; 375/257, 285, 216, 220

(56) References Cited

U.S. PATENT DOCUMENTS

| | | | |
|---|---|---|---|
| 6,259,745 B1 * | 7/2001 | Chan | 375/285 |
| 6,313,776 B1 | 11/2001 | Brown | |
| 6,389,077 B1 * | 5/2002 | Chan | 375/257 |
| 6,411,647 B1 * | 6/2002 | Chan | 341/130 |
| 6,459,684 B1 * | 10/2002 | Conroy et al. | 370/286 |
| 6,573,850 B1 * | 6/2003 | Pennock | 341/144 |

OTHER PUBLICATIONS

AD 8326 High Output Power Prgrammable CATV Line Driver Data Sheet. Analog Devices, Inc., One Technology Way, Norwood, MA 09062, pp. 1–23.

MAX3510 Upstream CATV Amplifier Data Sheet, Maxim Integrated Products, 120 San Gabriel Drive, Sunnyvale, CA 94086, pp. 1–7.

ARA1400/ 14001 CATV ReverseAmplifier with Step Attenuator Data Sheet, Anadigics, Inc. 35 Technology Drive, Warren, New Jersey 07059, pp. 1–12.

* cited by examiner

Primary Examiner—Michael Tokar
Assistant Examiner—Lam Mai
(74) Attorney, Agent, or Firm—Koppel, Jacobs, Patrick & Heybl

(57) ABSTRACT

Line drivers are provided that are suitable for driving communication cables (e.g., in Data Over Cable Service Interface Specification (DOCSIS) certified systems) without the need for output drivers and their size, power-consumption, noise and signal-distortion penalities. These line drivers directly couple switched current mirrors to a transformer's input winding to simultaneously provide currents in response to a differential input signal and a digital command signal and drive the load impedance to thereby realize a corresponding signal gain.

22 Claims, 4 Drawing Sheets

US 6,674,382 B1

LINE DRIVER STRUCTURES THAT ENHANCE DRIVER PERFORMANCE

CROSS REFERENCES TO RELATED APPLICATIONS

This application refers to and claims the benefit of U.S. Provisional Applications Ser. Nos. 60/379,333, 60/379,383 and 60/379,590 which were filed May 8, 2002.

BACKGROUND OF THE INVENTION

1. Field of the Invention

The present invention relates generally to line drivers.

2. Description of the Related Art

Line drivers are essentially digitally-controlled variable-gain amplifiers. An exemplary application of a line driver is a return-path (i.e., upstream) amplifier in Data Over Cable Service Interface Specification (DOCSIS) certified systems (e.g., data and telephony cable modems).

Because of varying distances between a cable modem and a cable headend, DOCSIS-compliant line drivers must have the capability of applying gain or attenuation in response to a digital command signal to thereby vary the power delivered to the load impedance (typically 75 ohms) of the interconnecting communication cable.

One example of a conventional line driver is a structure that includes a preamplifier, a set of resistive attenuators and an output driver which are serially-coupled between an input signal and the load impedance. In this arrangement, the resistive attenuators change their attenuation in response to the digital command signal.

Another exemplary line driver structure replaces the set of resistive attenuators with a series combination of a vernier and a multiplying digital-to-analog converter (MDAC) that both respond to the digital command signal.

In another line driver structure, the MDAC is replaced with a pair of MDACs and the output winding of a transformer is connected across the load impedance. Each of a pair of output drivers are then coupled between a respective one of the MDACs and a respective side of the transformer's input winding.

In yet another line driver structure, a preamplifier drives one input of a Gilbert-cell attenuator and a digital-to-analog converter responds to the digital command signal and drives another input of the Gilbert-cell attenuator. An output driver (e.g., a differential pair of transistors) then drives the load impedance in response to the output of the Gilbert-cell attenuator.

Although a variety of other line driver structures have been proposed, they and the above structures typically require output drivers whose parameters (e.g., size, power consumption,. noise and signal distortion) degrade the line driver's performance.

BRIEF SUMMARY OF THE INVENTION

The present invention is directed to line drivers that drive load impedances (e.g., communication cables) with elements that substantially improve driver performance and simplify driver structure.

These advantages are realized by directly coupling switched current mirrors to a transformer's input winding. The mirrors are thus enabled to simultaneously provide currents in response to a differential input signal and a digital command signal and drive the load impedance (via the transformer's output winding) to thereby realize a corresponding signal gain.

The novel features of the invention are set forth with particularity in the appended claims. The invention will be best understood from the following description when read in conjunction with the accompanying drawings.

DETAILED DESCRIPTION OF THE INVENTION

Figure 1:
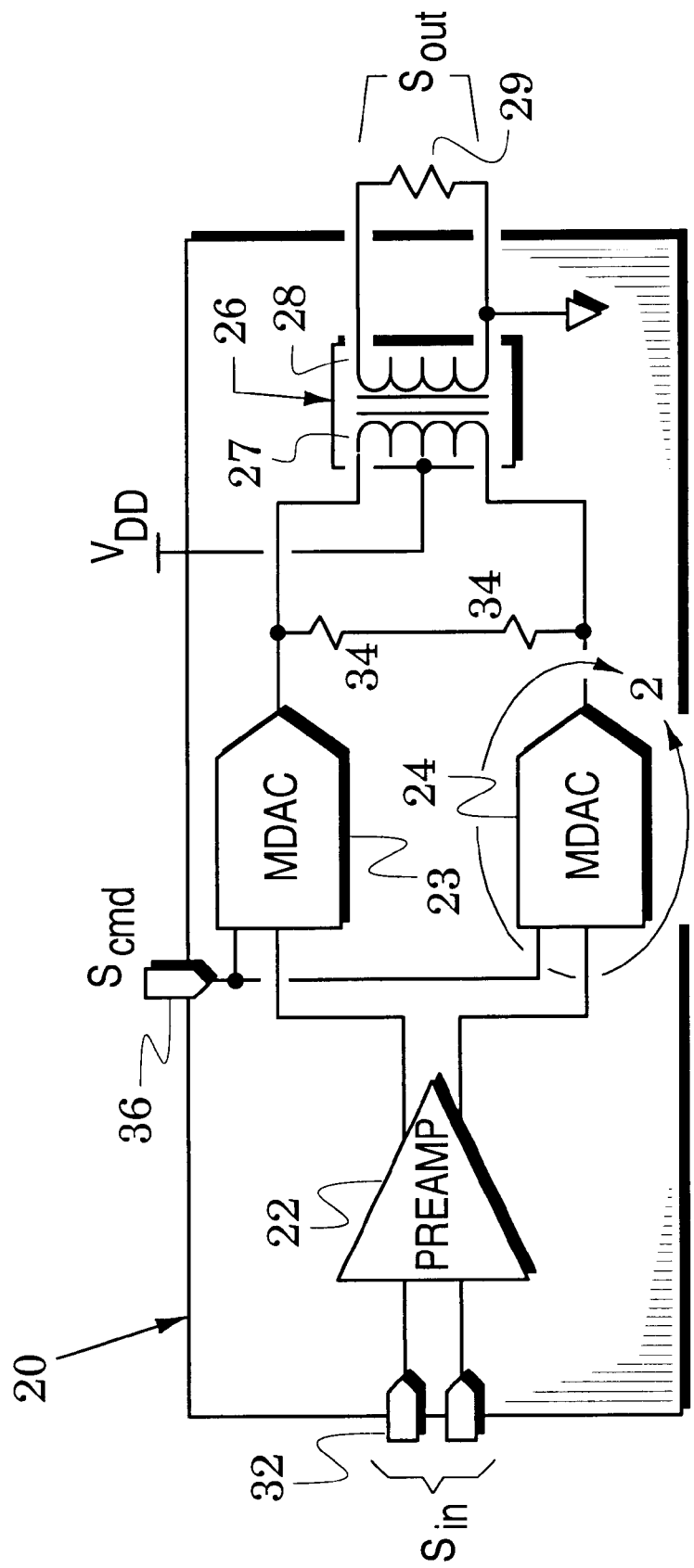
FIG. 1 is a block diagram of a line driver embodiment of the present invention.

FIG. 1 illustrates a line driver embodiment 20 which enhances diver performance and simplifies driver structure because it couples switched current mirrors directly to a transformer's input winding. The switched current mirrors are configured to realize gain steps of the line driver 20 while also providing the necessary current to drive a load impedance via the transformer's output winding. Because of this dual capability, independent drivers (e.g., complementary output drivers) are not required in this line driver structure and their additional die area, power dissipation, noise contribution and signal distortion is eliminated to thereby enhance the performance of the line driver.

In particular, the line driver 20 includes a preamplifier 22, a pair of multiplying digital-to-analog converters (MDACs) 23 and 24 and a transformer 26 that has an input winding 27 and also has an output winding 28 that is coupled across a load impedance 29 which represents, for example, the impedance of a communication cable. The preamplifier 22 respectively couples first and second sides of a differential driver input signal $S_{in}$ at an input port 32 to inputs of the first and second MDACs 23 and 24.

Outputs of the first and second MDACs are coupled respectively to first and second sides of the input winding 27. At least one resistor 34 is also coupled across the input winding 27 to establish an output impedance of the transformer that substantially matches the load impedance 29. Finally, a center tap of the input winding is coupled to a supply voltage $V_{DD}$.

In operation of the line driver 20, the signal gain of the first and second MDACs 23 and 24 corresponds to a digital command signal $S_{cmd}$ that is received at a command port 36. In response to the differential input signal $S_{in}$, the MDACs 23 and 24 provide drive currents that realize the commanded signal gain and also drive the load impedance 29 via the transformer 26.

Figure 2:
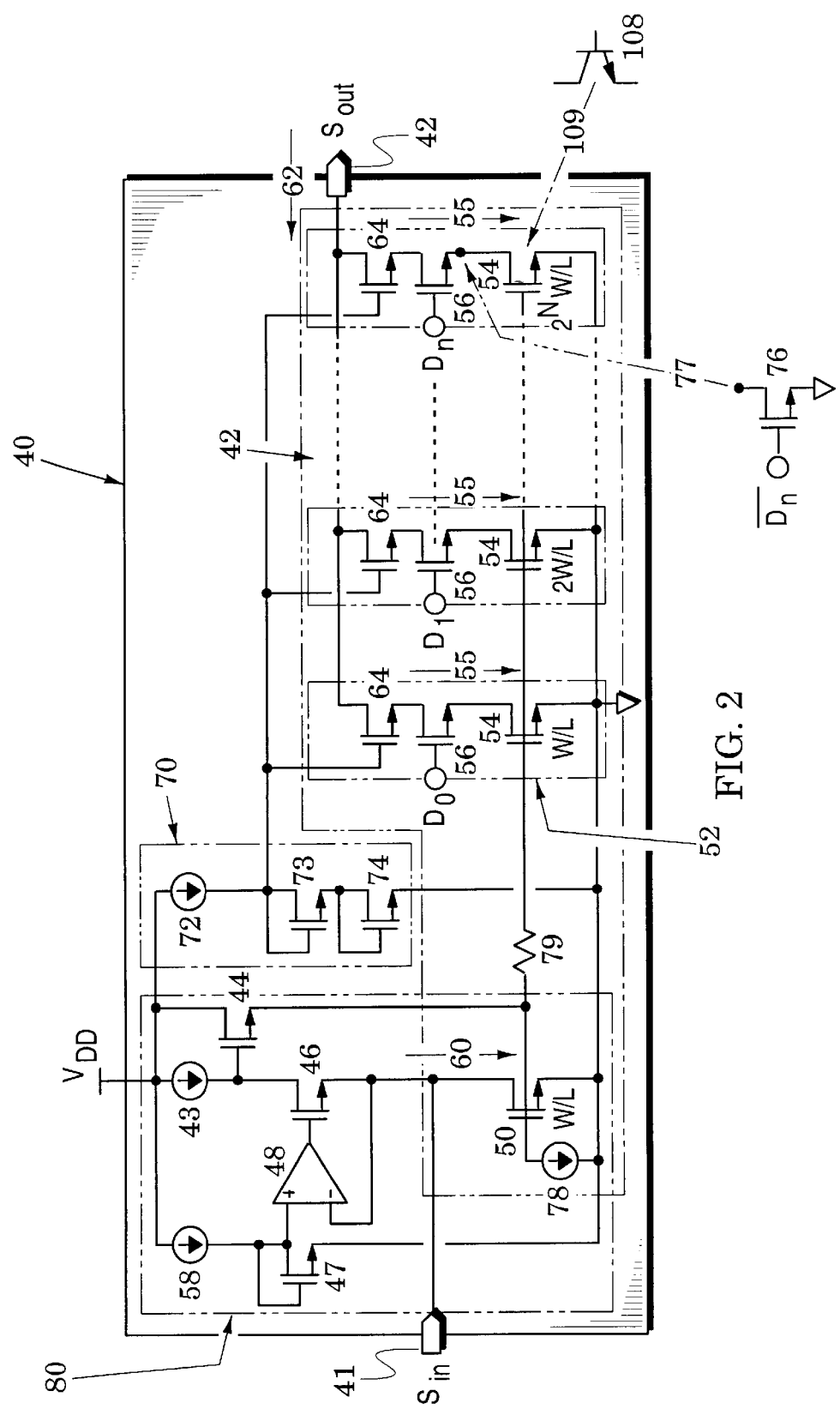
FIG. 2 is a schematic of an embodiment of the multiplying digital-to-analog converter (MDAC) encircled by the curved line 2 in FIG. 1.

Operation and structure of the line driver 20 can be further defined with reference to an MDAC embodiment 40 which is shown in FIG. 2. The MDAC 40 converts an input signal $S_{in}$ at an input port 41 to an analog output signal $S_{out}$ at an output port 42 with a conversion gain that corresponds to the digital command signal ($S_{cmd}$ in FIG. 1) which is exemplified in FIG. 2 by its bits $D_0$ - - - $D_n$.

The MDAC 40 includes a digital-to-analog converter (DAC) 42, a main current source 43 (coupled to $V_{DD}$), a drive transistor 44, a pass transistor 46, a diode-coupled transistor 47 and a differential amplifier 48. The DAC 42 is formed with a reference transistor 50 and associated switched current mirrors 52 that are each formed with current mirror transistors 54 whose currents 55 are passed through switch transistors 56 that are activated by respective ones of the digital command bits $D_0 - - - D_n$.

The drive transistor 44 has a control terminal (gate) that is coupled to receive the main current source 43 and a current terminal (source) that is coupled to the reference control terminal of the reference transistor 50. The pass transistor 46 has a first current terminal (drain) that is coupled to the main current source 43 and a second current terminal (source) that is coupled to a current terminal (drain) of the reference transistor 50.

A second current source 58 (coupled to $V_{DD}$) is preferably added to drive the diode-coupled transistor 47 and the differential amplifier 48 has a first input terminal (the noninverting input) coupled between the second current source and the diode-coupled transistor, a second input terminal (the inverting input) coupled to the reference current terminal of the reference transistor 50, and an output terminal coupled to drive the pass control terminal (gate) of the pass transistor 46. The input port 41 is coupled to the current terminal of the reference transistor 50.

In operation of the DAC 40, the gate-to-source voltage $V_{gs}$ of the reference transistor 50 is associated with a reference current 60 through the reference transistor and, because they share the same gate-to-source voltage $V_{gs}$, the current mirror transistors 54 mirror this current into the mirror currents 55. The mirror currents are passed through the switch transistors 56 in response to their respective bits ($D_0 - - - D_n$) of the digital command signal. These mirrored currents add to form a current 62 (which is the analog output signal $S_{out}$) at the output port 42.

The current mirror transistors 54 are preferably protected with cascode transistors 64 that are inserted between the switch transistors 56 and the output port 42. The control terminals (gates) of the cascode transistors are coupled to a junction between a bias current source 72 and a serially-coupled pair of diode-coupled transistors 73 and 74.

The bias current source 72 and the diode-coupled transistors form a reference 70 which thus establishes a potential of $V_{gs}$ at the drains of the switch transistors 56 (formed from the $V_{gs}$ of each of the diode-coupled transistors 73 and 74 less the $V_{gs}$ of the cascode transistors 64). This reduced potential safely limits the gate-to-drain voltage across the cascode transistors 64 as the potential applied to their control terminals changes in response to the digital command signal. Accordingly, they are protected from damage (e.g., gate oxide breakdown).

When a switch transistor 56 is turned off by its respective bit of the digital command signal, the potential of its source terminal is not established. Preferably, therefore, an auxiliary transistor 76 is inserted (as indicated by insertion arrow 77) between the source of a corresponding switch transistor 56 and ground. The auxiliary transistor responds to the inverse of the respective bit of the digital command signal so that, when a switch transistor 56 is turned off, its source terminal has an established potential (e.g., ground).

In operation of the MDAC 40, the drive transistor 44 acts as a source follower and provides substantial current to drive the nonlinear capacitance at the control terminals (gates) of the reference transistor 50 and the current mirrors 54. The diode-coupled transistor 47 is biased by the current source 58 to establish a gate-to-source voltage $V_{gs}$ at the noninverting input of the differential amplifier 48.

Because of the high gain of the differential amplifier and its coupled pass transistor 46, the negative feedback path about them will cause the voltage at the inverting input of the differential amplifier to substantially match the gate-to-source voltage $V_{gs}$ at the noninverting input. Accordingly, the impedance at the input port 41 is substantially reduced by the negative feedback and the potential at this port is established at a gate-to-source voltage $V_{gs}$. The lowered input impedance and the increased current drive substantially reduces signal distortion at the output of the MDAC 40.

It was noted above that the reference 70 establishes a potential of $V_{gs}$ at the drains of the switch transistors 56. When these transistors are biased on by the digital command signal, they are essentially small resistors so that a potential of substantially $V_{gs}$ is also established at the drains of the mirror transistors 54. It has been found that the $V_{gs}$ bias is particularly suited for maintaining both the mirror transistors 54 and the switch transistors 56 in their saturation region and that this further reduces signal distortion.

Because the drains of the mirror transistors and the drain of the reference transistor 50 are all at a similar potential of $V_{gs}$, current differences generated by $\lambda$ errors are reduced. The output impedance of integrated-circuit MOS transistors, for example, is less than infinity and, accordingly, different drain voltages will induce differences in the current relationship between the reference current 60 and the mirror currents 55.

The drive transistor 44 sources current to drive the nonlinear capacitance at the control terminals but it cannot sink current. Preferably, therefore, another current source 78 is coupled to the control terminal of the reference transistor 50 to sink current that further enhances the drive of the nonlinear capacitances and further reduces distortion. Also, a resistor 79 is preferably inserted between the current terminal of the drive transistor 44 and the control terminals of the current mirror transistors 54 to enhance the stability of the circuit loop that includes the reference transistor 50 and the drive transistor 44.

The main current source 43, the drive transistor 44, the pass transistor 46, the diode-coupled transistor 47, the differential amplifier 48, the reference transistor 50, the current source 78 and the resistor 79 form a reference current source 80 whose reference current 60 is altered by currents of the input signal $S_{in}$. These altered currents are then mirrored by the switched current mirrors 52 to form the current 62 at the output port 42.

The device sizes of the current mirror transistors 54 are scaled to appropriately set the step sizes of the analog output signal $S_{out}$. An exemplary scaling is indicated in FIG. 2 in which the reference transistor 50 has a W/L relationship in the width and length of its control terminal (gate). A first current mirror transistor 54 of FIG. 2 has the same W/L relationship so that its respective current 55 substantially matches the reference current 60 in the reference transistor.

However, a second current mirror transistor 54 has 2W/L relationship so that its respective current 55 is twice that of the reference current 60 to thereby realize a 6 dB increase in the analog output signal $S_{out}$. An additional 6 dB increase is realized in each added mirror transistor so that a last Nth added mirror transistor has a $2^N$W/L relationship in the width and length of its control terminal (to facilitate fabrication, it may be desirable to fabricate unit transistors and realize the increased W/L relationship by simply combining an appropriate number of unit transistors). The current mirrors are thus sized to provide binarily-weighted currents (it is recognized, however, that different line driver embodiments of the invention can be formed with current mirrors that have different current relationships).

It is noted that this device scaling sets the DC currents of the analog output signal $S_{out}$ in accordance with bits $D_0$ - - - $D_n$ of the digital command signal (36 in FIG. 1). The input signal $S_{in}$ at the input port 41 is preferably a current signal which adds to and subtracts from the reference current 60 of the reference transistor 50. Accordingly, this input AC current will be mirrored by the mirror transistors 54 and the mirrored currents appear as the analog output signal $S_{out}$ at the output port 42. As each additional current mirror transistor 54 is enabled by the digital command signal, the output AC current will increase an additional 6 dB. It is further noted that, while the size relationships between the current mirror transistors sets the MDAC's gain steps, the size relationship between the first current mirror transistor 54 and the reference transistor 50 is arbitrary and need not be one-to-one.

Attention is now returned to the line driver 20 of FIG. 1 where it is apparent that the MDAC of FIG. 2 is especially suited for use as the first and second MDACs 23 and 24. The reference current source (80 in FIG. 2) of each MDAC then generates a reference current (60 in FIG. 2) in response to a respective side of the differential input signal $S_{in}$ of FIG. 1. The switched current mirrors (52 in FIG. 2) are referenced to the reference current source (80 in FIG. 2) to thereby mirror the reference current (60 in FIG. 2) into output currents (62 in FIG. 2).

In an important feature of the present invention, the switched current mirrors (52 in FIG. 2) of each MDAC are directly connected to a respective side of the input winding 27 of FIG. 1 and their elements (e.g., the mirror transistors 54) are sized to generate currents in the input winding whose magnitudes will be sufficient to cause the output winding 28 to drive the load impedance 29. The resistors 34 of FIG. 1 are then selected to establish an output impedance of the transformer that substantially matches the load impedance 29 (a pair of resistors is shown to facilitate coupling of a common end to the supply voltage $V_{DD}$).

Because the MDACs 23 and 24 of FIG. 1 directly drive the input winding 27, line drivers of the invention eliminate output drivers that have typically added noise, size, signal distortion and/or power consumption in conventional line drivers. Although other embodiments of the invention provide a single MDAC to drive a single side of the input winding, device sizes (e.g., of the mirror transistors 54 of FIG. 2) are preferably reduced by arranging first and second MDACs (as shown in FIG. 1) to drive respective ends of the input winding 27.

Figure 3:
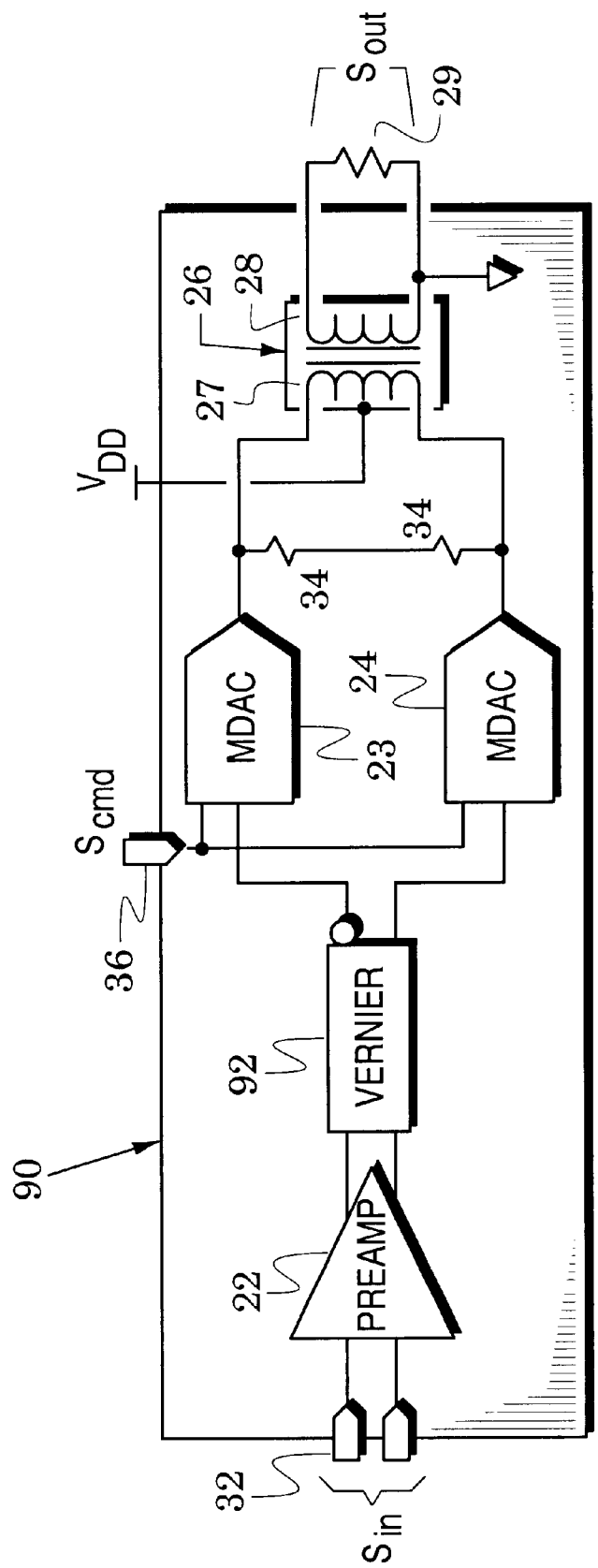
FIGS. 3 and 4 are block diagrams of other line driver embodiments of the present invention.

The preamplifier 20 of FIG. 1 buffers the input signal and provides the necessary current drive to each of the first and second MDACs 23 and 24. FIG. 3 illustrates another line driver embodiment 90 in which a differential vernier 92 is inserted between the preamplifier 22 and the first and second MDACs 23 and 24. In addition to the vernier 92, the embodiment 90 includes the elements of the line driver 20 with like elements indicated by like reference numbers.

In an exemplary embodiment of the line driver 90, the switched current mirrors (52 in FIG. 2) in each of the MDACs 23 and 24 are configured to provide 6 dB steps in the output signal $S_{out}$ (via the transformer 26) and the differential vernier 92 configured to provide fine steps (e.g., 0.5 dB or 1 dB) in the differential current that it provides to the MDACs. In this embodiment, the line driver provides fine resolution (0.5 dB or 1 dB) across the entire range of the output signal $S_{out}$.

The mirror current 55 of each of the current mirror transistors 54 of FIG. 2 may be expressed as $(k/2)(W/L)(V_{gs}-V_t)^2$ in which k is a transistor constant, W and L are the width and length of the transistor's control terminal and $V_t$ is the transistor's threshold voltage. Preferably, each of the current mirror transistors 54 comprises a plurality of unit transistors to reduce errors induced by fabrication variations in W, L and $V_t$.

Although some of the current scaling of the various current mirror transistors can be accomplished with different numbers of unit transistors, the above-described need to maintain a plurality of unit transistors in each mirror requires that the size of the devices must generally differ to realize all of the different mirrored currents. Accordingly, an MDAC with a large number of bits (e.g., eight) may require device size variations (from least significant to most significant bit) that require very small and/or very large device sizes. The small device sizes magnify fabrication errors in W, L and $V_t$ and the large device sizes use undesirably large die areas.

Figure 4:
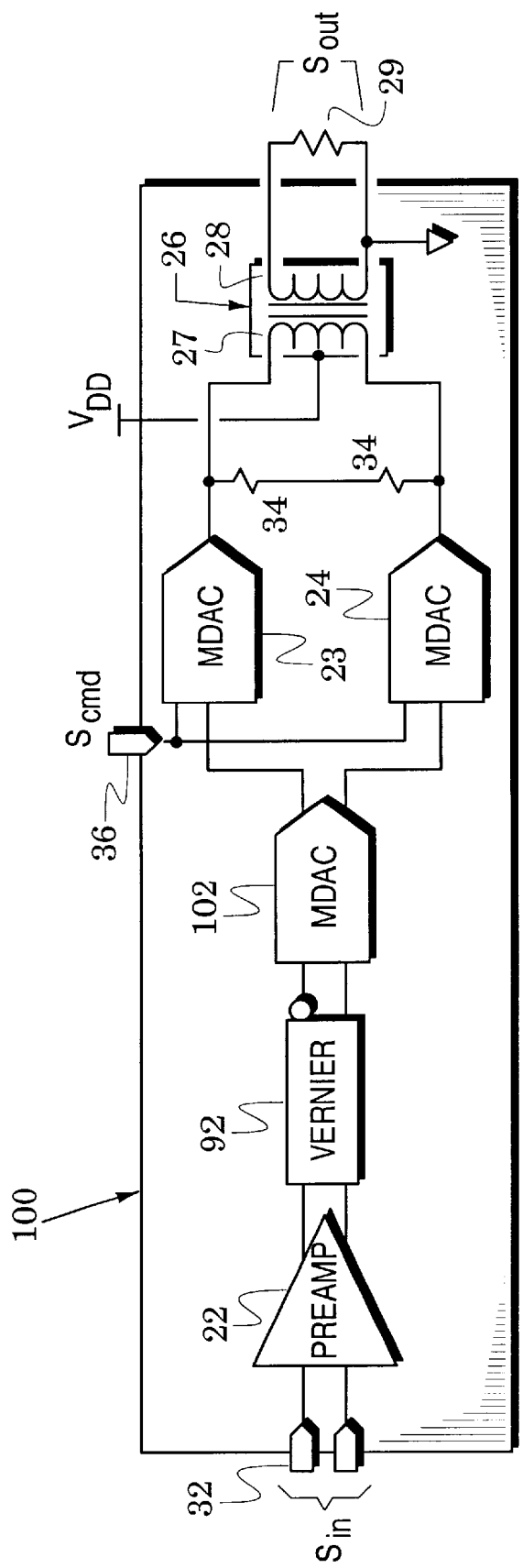

In response to this problem, FIG. 4 illustrates a line driver 100 that is similar to the line driver 90 of FIG. 3 (with like elements indicated by, like reference numbers) but which inserts a third MDAC 102 between the vernier 92 and the first and second MDACs 23 and 24. The number of bits can then be divided with more significant bits assigned to the first and second MDACs 23 and 24 and less significant bits assigned to the third MDAC 102. Because the range of output currents has been reduced in the third MDAC 102 and also in each of the first and second MDACs 23 and 24, the variation of device sizes may now be reduced in each of the MDACs which significantly simplifies fabrication of these systems.

An exemplary version of the line driver 100 could be configured with 59 dB of gain variation by assigning, for example, five 1 dB steps to the vernier 92, three 6 dB gain steps to the third MDAC 102, and six 6 dB gain steps to the first and second MDACs 23 and 24. Because the most-significant bit gain steps are realized with switched current mirrors that mirror the greatest output currents, these gain steps are preferably assigned to the first and second MDACs 23 and 24. Generally, their currents (and device sizes) need only be slightly enlarged to sufficiently drive the input winding 27. The corresponding mirror transistors (e.g., 54 in FIG. 2) typically require only a slight increase in device size to drive the respective end of the input winding (27 in FIG. 4). The smaller currents of the least-significant bits can be then realized via the third MDAC 102.

Although the MDAC 40 has been illustrated in FIG. 3 with MOS transistors, the teachings of the invention can be practiced with various other transistor types. For example, bipolar junction transistors can be substituted as exemplified by the transistor 108 which is substituted by substitution arrow 109 in FIG. 2 for the mirror transistor 54.

The concept of gain has been used in the above description of embodiments of the invention. It is intended that this concept is broadly interpreted and it, accordingly, refers to any change of signal amplitude whether that change is an increase or a decrease of signal amplitude.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A line driver that responds to a differential driver input signal and drives a load impedance with a signal gain that corresponds to a digital command signal, comprising:

a transformer that has an input winding and also has an output winding for coupling across said load impedance; and at least one multiplying digital-to-analog converter (MDAC) that includes:
a) a reference current source that generates a reference current in response to a respective side of said differential driver input signal; and
b) a plurality of switched current mirrors that are directly connected to a respective side of said input winding and are referenced to said reference current source to thereby mirror said reference current into output currents that are switched to said respective side in response to said digital command signal.

2. The line driver of claim 1, wherein said at least one MDAC comprises first and second MDACs whose reference current sources respond to respective sides of said differential driver input signal and whose switched current mirrors are directly connected to respective sides of said input winding.

3. The line driver of claim 2, further including a preamplifier inserted to respectively couple first and second sides of said differential driver input signal to the reference current sources of said first and second MDACs.

4. The line driver of claim 1, further including at least one resistor connected across said input winding to establish an output impedance of said transformer that substantially matches said load impedance.

5. The line driver of claim 1, wherein said current mirrors are configured to provide binarily-related output currents in response to said digital command signal.

6. The line driver of claim 1, wherein each of said switched current mirrors includes:
a mirror transistor that mirrors said reference current into one of said output currents; and
a switch transistor that passes said output current in response to said digital command signal.

7. The line driver of claim 6, wherein each of said switched current mirrors further includes a cascode transistor and said switch transistor is coupled between said mirror transistor and said cascode transistor.

8. The line driver of claim 6, wherein said reference current source includes a reference transistor that has a control terminal and a current terminal and wherein:
said current terminal is coupled to one side of said differential driver input signal; and
said control terminal is coupled to bias said mirror transistor.

9. A line driver that responds to a differential driver input signal and drives a load impedance with a signal gain that corresponds to a digital command signal, comprising:
a transformer that has an input winding and also has an output winding for coupling across said load impedance;
at least one reference current source that generates a reference current in response to a respective side of said differential driver input signal; and
at least one set of switched current mirrors that are directly connected to a respective side of said input winding and are referenced to said reference current source to thereby mirror said reference current into output currents that are switched to said respective side in response to said digital command signal.

10. The line driver of claim 9, wherein said at least one reference current source comprises first and second reference current sources that respond to respective sides of said differential driver input signal and said at least one set of switched current mirrors comprises first and second sets of switched current mirrors that are directly connected to respective sides of said input winding.

11. The line driver of claim 10, further including a preamplifier inserted to couple differential driver input signal across said first and second reference current sources.

12. The line driver of claim 11, further including at least one resistor connected across said input winding to establish an output impedance of said transformer that substantially matches said load impedance.

13. The line driver of claim 11, wherein said current mirrors are configured to provide binarily-related output currents in response to said digital command signal.

14. The line driver of claim 9, wherein each of said switched current mirrors includes:
a mirror transistor that mirrors said reference current into one of said output currents;
a switch transistor that passes said output current in response to said digital command signal.

15. The line driver of claim 14, wherein each of said switched current mirrors further includes a cascode transistor and said switch transistor is coupled between said mirror transistor and said cascode transistor.

16. The line driver of claim 14, wherein said reference current source includes a reference transistor that has a control terminal and a current terminal and wherein:
said current terminal is coupled to one side of said differential driver input signal; and
said control terminal is coupled to bias said mirror transistor.

17. A line driver that responds to a differential driver input signal and drives a load impedance with a signal gain that corresponds to a digital command signal, comprising:
a transformer that has an input winding and also has an output winding for coupling across said load impedance;
a pair of initial multiplying digital-to-analog converters (MDACs) that each includes:
a) an initial reference current source that generates an initial reference current in response to a respective side of said differential driver input signal; and
b) a plurality of initial switched current mirrors that are referenced to said initial reference current source to thereby mirror said initial reference current into initial output currents that are switched in response to an initial portion of said digital command signal; and
a pair of final multiplying digital-to-analog converters (MDACs) that each includes:
a) a final reference current source that generates a final reference current in response to the initial output currents of a respective one of said initial MDACs; and
b) a plurality of final switched current mirrors that are directly connected to a respective side of said input winding and are referenced to said final reference current source to thereby mirror said final reference current into final output currents that are switched in response to a final portion of said digital command signal.

18. The line driver of claim 17, further including:
a vernier that converts said differential input signal to a differential vernier current with a conversion gain that corresponds to a vernier portion of said digital command signal; and
a preamplifier inserted to couple said differential driver input signal to said vernier;
wherein said initial reference current source responds to a respective side of said differential vernier current.

19. The line driver of claim 17, further including at least one resistor connected across said input winding to establish an output impedance of said transformer that substantially matches said load impedance.

20. The line driver of claim 17, wherein each of said initial switched current mirrors includes:
- an initial mirror transistor that mirrors said initial reference current into one of said initial output currents; and
- an initial switch transistor that passes said initial output current in response to said initial portion of said digital command signal;

and wherein each of said final switched current mirrors includes:
- a final mirror transistor that mirrors said final reference current into one of said final output currents; and
- a final switch transistor that passes said final output current in response to said final portion of said digital command signal.

21. The line driver of claim 20, wherein each of said initial switched current mirrors further includes an initial cascode transistor and said initial switch transistor is coupled between said initial mirror transistor and said initial cascode transistor and wherein each of said final switched current mirrors further includes a final cascode transistor and said final switch transistor is coupled between said final mirror transistor and said final cascode transistor.

22. The line driver of claim 20, wherein said initial reference current source includes an initial reference transistor that has an initial control terminal and an initial current terminal and wherein:
- said initial current terminal is coupled to one side of said differential driver input signal; and
- said initial control terminal is coupled to bias said initial mirror transistor;

and wherein said final reference current source includes a final reference transistor that has a final control terminal and a final current terminal and wherein:
- said final current terminal is coupled to receive the initial output currents of a respective one of said initial MDACs; and
- said final control terminal is coupled to bias said final mirror transistor.

* * * * *